US008669893B2

(12) United States Patent
Sawyers

(10) Patent No.: US 8,669,893 B2
(45) Date of Patent: Mar. 11, 2014

(54) PERFORMING MULTIPLICATION USING AN ANALOG-TO-DIGITAL CONVERTER

(75) Inventor: Thomas P. Sawyers, Hempstead, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 87 days.

(21) Appl. No.: 13/202,814

(22) PCT Filed: Apr. 28, 2009

(86) PCT No.: PCT/US2009/041980
§ 371 (c)(1), (2), (4) Date: Aug. 23, 2011

(87) PCT Pub. No.: WO2010/126490
PCT Pub. Date: Nov. 4, 2010

(65) Prior Publication Data
US 2011/0304378 A1 Dec. 15, 2011

(51) Int. Cl.
*H03M 1/12* (2006.01)

(52) U.S. Cl.
USPC .......... 341/155; 323/273

(58) Field of Classification Search
USPC .......... 341/155, 158, 114, 169; 323/273, 269
See application file for complete search history.

(56) References Cited

U.S. PATENT DOCUMENTS

| | | | | |
|---|---|---|---|---|
| 4,476,438 | A * | 10/1984 | Cantou | 330/149 |
| 4,495,463 | A * | 1/1985 | Milkovic | 324/142 |
| 5,034,905 | A | 7/1991 | Widdau | |
| 5,396,447 | A * | 3/1995 | Suntken | 708/835 |
| 6,362,767 | B1 | 3/2002 | Yang | |
| 6,563,319 | B1 * | 5/2003 | Kraz | 324/458 |
| 6,717,393 | B2 * | 4/2004 | Male | 324/76.17 |
| 6,765,516 | B1 * | 7/2004 | Coley et al. | 341/126 |
| 6,784,824 | B1 * | 8/2004 | Quinn | 341/172 |
| 7,184,914 | B2 | 2/2007 | Atsuta et al. | |
| 7,446,691 | B2 | 11/2008 | Paul | |
| 8,159,201 | B2 * | 4/2012 | Lin et al. | 323/273 |
| 2002/0125924 | A1 | 9/2002 | Kurogouchi et al. | |
| 2005/0090998 | A1 | 4/2005 | Atsuta et al. | |
| 2008/0024351 | A1 * | 1/2008 | Gupta et al. | 341/172 |
| 2008/0150777 | A1 | 6/2008 | Rangan | |
| 2008/0187078 | A1 * | 8/2008 | Hong et al. | 375/350 |
| 2011/0150237 | A1 * | 6/2011 | Nagasue et al. | 381/94.1 |
| 2012/0274404 | A1 * | 11/2012 | Erdogan et al. | 330/293 |

FOREIGN PATENT DOCUMENTS

| | | |
|---|---|---|
| CN | 2032324 | 2/1989 |
| CN | 1272726 | 11/2000 |
| CN | 1367304 | 9/2002 |

OTHER PUBLICATIONS

International Search Report and Written Opinion for PCT Application No. PCT/US2009/041980, Dated Dec. 28, 2009, pp. 12.
Delta-Sigma Algorithmic Analog-to-Digital Conversion, Mulliken et al., Circuits and Systems, 2002, ISCAS 2002 (4 pages).

* cited by examiner

*Primary Examiner* — Peguy Jean Pierre

(57) ABSTRACT

A multiplier circuit to multiply a first signal with a second signal includes an analog-to-digital converter that has a first input and a second input. The first input is to receive the first signal. The multiplier circuit also has an inverting circuit having an input to receive the second signal, and an output connected to the second input of the analog-to-digital converter. An output value produced by a combination of the analog-to-digital converter and the inverting circuit is approximately a multiplication of the first signal and the second signal.

16 Claims, 2 Drawing Sheets

PERFORMING MULTIPLICATION USING AN ANALOG-TO-DIGITAL CONVERTER

CROSS-REFERENCE TO RELATED APPLICATION

This application is a national stage application under 35 U.S.C. §371 of PCT/US2009/041980, filed Apr. 28, 2009.

BACKGROUND

In electronic devices, such as computer systems or other types of electronic devices, some operations involve multiplication of signals. Typically, such multiplication is performed using a microcontroller or other type of processor. However, under certain scenarios, using a processor to perform multiplications in electronic devices may not be efficient.

BRIEF DESCRIPTION OF THE DRAWINGS

Some embodiments of the invention are described with respect to the following figures.

DETAILED DESCRIPTION

In accordance with some embodiments, instead of using a processor (e.g., a microcontroller, microprocessor, etc.) to perform multiplication of signals within an electronic device (e.g., a computer, personal digital assistant, mobile telephone, storage system, communications switch, etc.), a multiplier circuit that includes an analog-to-digital converter (ADC) is used instead for enhanced efficiency. The multiplier circuit, used to multiply at least a first signal with a second signal, includes the ADC and an inverting circuit. The ADC has a first input to receive the first signal and a second input to receive an output of the inverting circuit. The inverting circuit has an input to receive the second signal that is to be multiplied with the first signal. An output value produced by combination of the ADC and the inverting circuit is approximately a multiplication of the first signal and the second signal.

An ADC is a circuit to convert an analog signal to a digital signal. An "inverting circuit" refers to a circuit whose output decreases in a signal level (e.g., voltage amplitude level) in response to an increase in signal level at the input of the inverting circuit, and vice versa.

Using the multiplier circuit according to some embodiments to perform multiplication operations instead of a processor in an electronic device, more efficient usage of the processor can be achieved, since processor cycles do not have to be consumed to perform the multiplication operations. Moreover, the electronic device may have a power savings mode, in which the processor of the electronic device may be placed into a lower power state where the processor may not be available to perform most or all of the operations of the processor. In a conventional electronic device in which a processor is used to perform multiplications, if a multiplication has to be performed, then the processor that is in a lower power state may have to be awakened (or turned "on") to allow the processor to perform the desired multiplication. This would result in increased and wasteful power consumption in the electronic device since the processor is being awakened just to perform the multiplication. If multiplication operations are regularly performed, then the processor would have to be regularly awakened to perform such multiplication operations.

Figure 1:
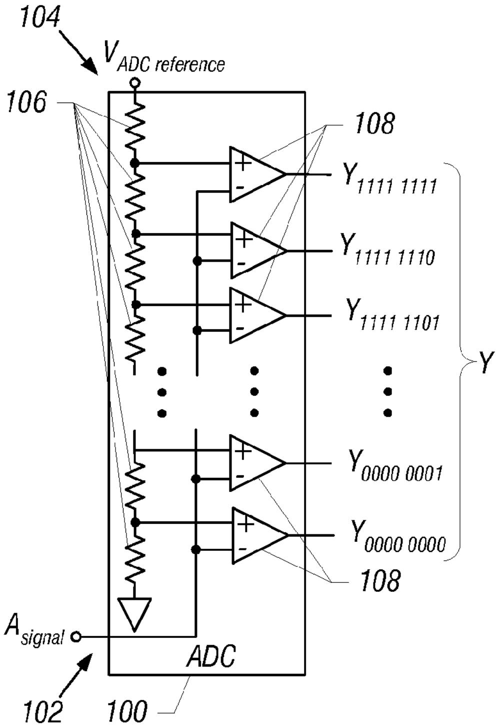
FIG. 1 is a schematic diagram of an exemplary analog-to-digital (ADC) circuit.

FIG. 1 illustrates an exemplary ADC 100. The ADC 100 has a first input (signal input) 102 and a second input (reference voltage input) 104, where the signal input 102 is for connection to an analog input signal that is represented as $A_{signal}$. The reference voltage input 104 of the ADC 100 is for connection to a reference voltage, referred to as $V_{ADC\_reference}$. The output of the ADC 100 is a digital signal Y that includes a number of bits (represented as $Y_{00000000}$, $Y_{00000001}$, . . . , $Y_{11111110}$, $Y_{11111111}$). In the example of FIG. 1, the ADC 100 provides a 16-bit output signal Y. In different implementations, the output signal Y can include different numbers of output bits.

The ADC 100 basically takes a ratio of the analog input signal $A_{signal}$ to the reference voltage $V_{ADC\_reference}$ ($A_{signal}/V_{ADC\_reference}$) to produce the digital output signal (Y). In other words, the digital output signal (Y) is proportional to the ratio of $A_{signal}$ to $V_{ADC\_reference}$, or $$Y \propto \frac{A}{V_{ADC\_reference}}.$$

According to this relationship, the digital output signal Y is proportional to the analog input signal $A_{signal}$, which means that the digital output signal Y proportionately increases or decreases with the analog input signal $A_{signal}$.

On the other hand, the digital output signal Y has an inverse proportional relationship to the reference voltage $V_{ADC\_reference}$. An increase in the amplitude of $V_{ADC\_reference}$ (assuming $A_{signal}$ stays constant) results in a decrease in the output value (Y), while a decrease in the amplitude of $V_{ADC\_reference}$ results in an increase in the output value (Y).

In the example shown in FIG. 1, the ADC 100 includes a series of resistors 106, and a number of comparators 108 to produce respective output bits of Y. The series of resistors 106 are connected between $V_{ADC\_reference}$ and a ground reference. The series of resistors effectively form voltage dividers such that different nodes along the series of resistors 106 are at different voltages.

The input analog signal $A_{signal}$ is connected to the inverting (−) inputs of the comparators 108, while respective nodes of the series of resistors 106 are connected to corresponding non-inverting (+) inputs of the comparators 108. The comparators 108 output respective output bits based on a comparison of $A_{signal}$ to the respective voltage level received at the non-inverting input of the comparator 108. It is noted that other components of the ADC 100 are not shown—the components depicted are provided to illustrate the relationship between $A_{signal}$ and $V_{ADC\_reference}$.

In view of the fact that the ADC 100 effectively takes a ratio of the first input (102) to the second input (104), this characteristic can be used to form a multiplier circuit that uses the ADC 100. Such a multiplier circuit for multiplying input signals A and B is depicted as multiplier circuit 200 in FIG. 2, which includes the ADC 100 and an inverting circuit 202.

The inverting circuit 202 receives input signal B and applies an inverting operation on the signal to produce signal B'. The signal B' output from the inverting circuit 202 is then provided to the reference voltage input 104 of the ADC 100. The ADC 100 takes a ratio of A to B', which effectively is a multiplication of A and B.

Figure 2:
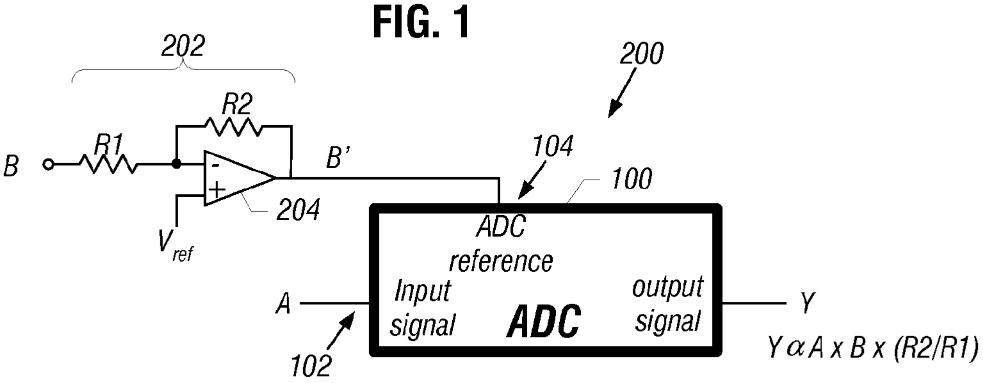
FIGS. 2-3 are schematic diagrams of circuitry according to some embodiments for performing multiplication of signals.

In the embodiment of FIG. 2, the inverting circuit 202 includes an operational amplifier 204 and resistors R1 and R2. The resistor R2 is connected between the inverting (−) input of the operational amplifier 204 and the output of the operational amplifier 204, while the resistor R1 is connected between the inverting input of the operational amplifier 204 and input signal B. The non-inverting (+) input of the operational amplifier 204 is connected to an independent reference voltage $V_{ref}$, where $V_{ref}$ is a generally fixed voltage level. The output (B') of the operational amplifier 204 is connected to the voltage reference input 104 of the ADC 100.

The gain of the operational amplifier 204 shown in FIG. 2 is −1, such that there is an inverse relationship between the input of the operational amplifier 204 and its output. In one example implementation, the relationship between B' and B is as follows: $B'=2\times V_{ref}-B$. An increase in B will cause a decrease in B', and vice versa.

The ADC 100 in FIG. 2 receives signal A at its analog signal input 102. Since the output Y of the ADC 100 has the relationship $$Y \propto \frac{A}{V_{ADC\_reference}},$$

as explained above in connection with FIG. 1, the relationship between Y and A, B is expressed as follows:

$$Y \propto \frac{A}{2\times V_{ref}-B}.$$

According to this relationship, a change in the value of input signal A causes a proportional change in the output value Y. Moreover, the output value Y changes in proportion to $$\frac{1}{1-\Delta B/V_{ref}},$$

where ΔB represents a change in the input signal B. In one example, a 1% increase in A results in a 1% increase in the output Y, while a 1% increase in B results in a $$\frac{1}{1-0.01}=1.010101\%$$

decrease in the output Y.

The multiplier circuit 200 of FIG. 2 provides a relatively good approximation of the multiplication of input signals A and B for small variations in the value of B. The output value Y is expressed as follows:

$$Y \propto A\times B\times \frac{R2}{R1}.$$

If R2 is selected to be equal to R1, then Y is basically an approximation of the scaled multiplication of just A and B.

The output value Y is considered an "approximation" of the multiplication of A and B because of the errors introduced due to possible variations of B. For small variations in B from a nominal value of B, the output value Y is a relatively accurate representation of the multiplication of A and B. However, for larger variations of B, an error is introduced such that the multiplication is less accurate (but still possibly usable for certain applications).

The table below illustrates the relationship of variations in B (ΔB)) to errors in the output value Y, according to one example (the table is provided for purposes of example, since relationships between ΔB and the error in Y are implementation-specific and can differ for different implementations):

| ΔB | Y error |
|---|---|
| 0.1% | 0.0001% |
| 1% | 0.01% |
| 2% | 0.04% |
| 5% | 0.251% |
| 10% | 1.01% |
| 20% | 4.167% |
| 50% | 33.33% |

If B varies by 0.1%, then the output Y has an error of approximately 0.0001%. If B varies by 1%, then the output Y has an error of approximately 0.01%. If B varies by 5%, then the output Y has an error of approximately 0.251%. If B varies by 10%, then the output Y has an error of approximately 1.01%. According to the example above, it can be seen that even with a 20% variation in B, the output error is still under 5%, which may be acceptable for certain applications.

Figure 3:
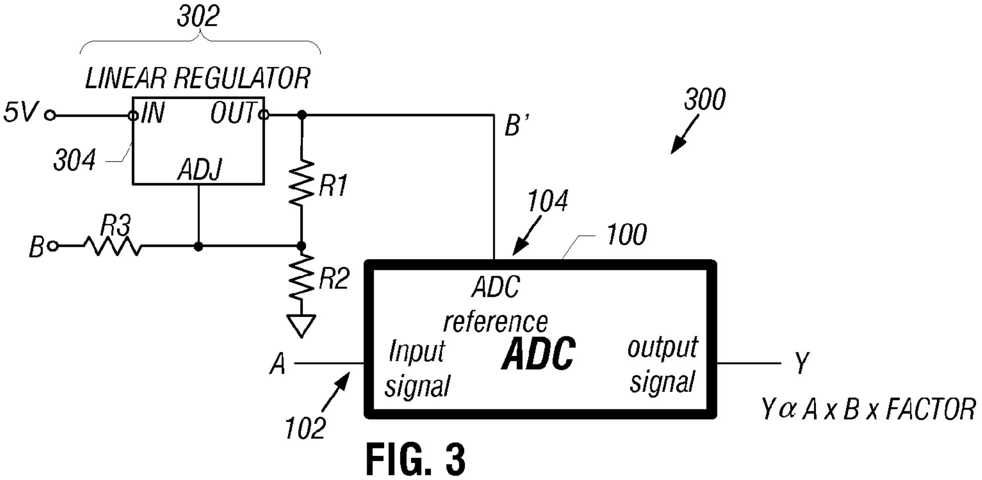

FIG. 3 shows an alternative embodiment of a multiplier circuit 300 for multiplying input signals A and B. The multiplier circuit 300 includes the ADC 100 and an inverting circuit 302 that includes a linear regulator 304 and resistors R1, R2, and R3. The linear regulator 302 has an input to receive an input voltage (e.g., 5V) and an output to provide an output voltage (represented as B') that is connected to the ADC reference voltage input 104. The input signal B is provided through the resistor R3 to an adjustment input (ADJ) of the linear regulator 302. The resistors R1 and R2 are connected between B' and a ground reference, and the intermediate node between R1 and R2 is connected to a node of R3 and the ADJ input of the linear regulator 302.

The linear regulator 302 is a voltage regulator that operates in a linear region. The output voltage provided by the linear regulator 302 is fixed at a particular voltage based on the voltage level at the ADJ input of the linear regulator 304. Changes in voltage level at the ADJ input will cause a change to the output voltage level from the linear regulator 302.

In the arrangements shown in FIG. 3, an increase in the value of B causes a decrease in the value of B', and vice versa. Thus, this arrangement is considered to provide an inverting operation between B and B'.

The output value Y produced by the ADC 100 that is an approximate multiplication of A and B is scaled by a fixed scaling factor (FACTOR). In other words, the output (Y) of the multiplier circuit 300 is equal to A×B×FACTOR, where the value of FACTOR is dependent upon the values of R1, R2, and R3.

In an alternative implementation, an ADC may not include a reference voltage input 104 as is present in the ADC 100 of FIG. 2 or 3. For example, an ADC 100A that is part of a multiplier circuit 300A depicted in FIG. 6 includes a power supply input 104A (labeled "VCC" in FIG. 6) but does not include the reference voltage input 104 of FIG. 2 or 3. A power supply voltage is provided to the power supply input 104A of the ADC 100A to power the ADC 100A. In the embodiment shown in FIG. 6, the power supply voltage is provided by the inverting circuit 302 that includes the linear regulator 304 (described in connection with FIG. 3).

In this embodiment, the ADC reference voltage ($V_{ADC\ reference}$) is generated internally in the ADC 100A. The ADC reference voltage ($V_{ADC\ reference}$) is produced by a circuit 600 that is tied to the VCC input 104A. In some implementations, the circuit 600 can be a conductive line that connects $V_{ADC\ reference}$ to VCC. In another implementation, the circuit 600 may be a voltage divider circuit.

Since the internal ADC reference voltage ($V_{ADC\ reference}$) is proportional to VCC, the output Y of the ADC 100A is approximately a multiplication of A and B (and FACTOR), similar to the multiplier circuit 300 of FIG. 3.

Figure 4:
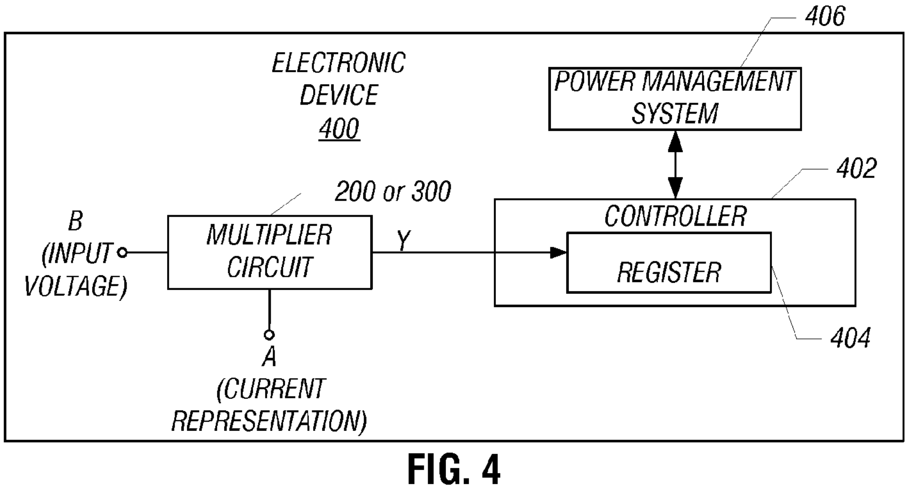
FIG. 4 is a block diagram of components in an electronic device that uses a multiplier circuit according to an embodiment.
Figure 6:
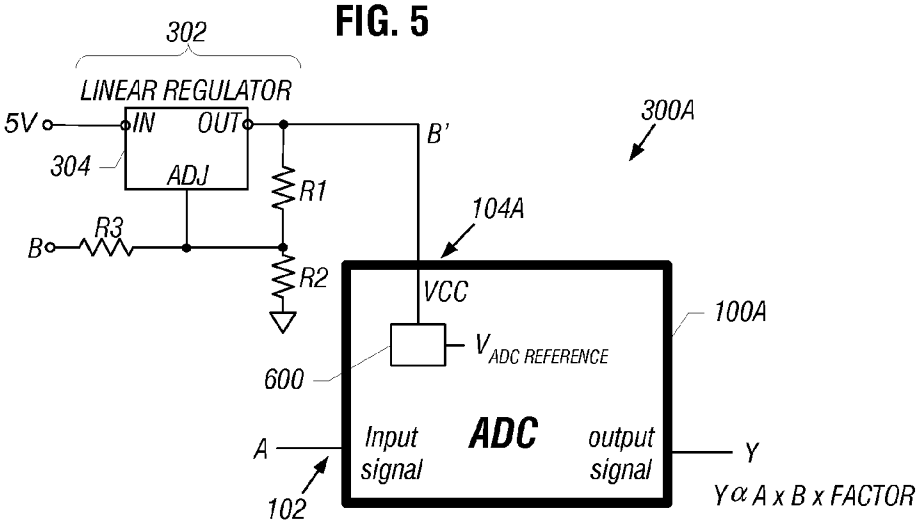
FIG. 6 is a schematic diagram of circuitry according to another embodiment for performing multiplication of signals.

The multiplier circuit shown in FIG. 2, 3 or 6 can be used in the context of power monitoring. In one example, as shown in FIG. 4, an electronic device 400 (e.g., computer, personal digital assistant, mobile telephone, storage system, communications switch, etc.) includes the multiplier circuit 200 or 300, which receives input signals A and B. The input signal B can represent an input voltage, such as a power supply voltage used to power components of the electronic device, that is relatively stable (B has a relatively small range of variation such that the multiplier circuit 200, 300, or 300A can provide relatively accurate multiplications of A and B). The input signal A can be a representation of an electrical current, such as a current that is received from the power supply voltage used to power components of the electronic device, such as a power adapter (not shown) of the electronic device 400 or from another power source of the electronic device 400. The input signal A can have wide variations due to varying power consumption of the electronic device 400 (e.g., the electronic device 400 transitioning between very active states and idle states, the electronic device 400 transitioning between different power states, etc.).

The multiplier circuit 200, 300, or 300A multiplies A and B to produce Y, which represents power (note that voltage multiplied by electrical current is equal to power). The output value Y (a digital value) is received by a controller 402, which includes a register 404 to store the output value Y. Multiple instances of the output value Y can be collected at different time points during a particular time interval. This allows the controller 402 to collect indications of power consumption over time in the particular time interval. The controller 402 can efficiently store such indications of power consumption, which can be later retrieved, such as by a power management system 406.

The power management system 406 is able to read the indications of power consumption collected in the register 404 to determine power consumption of the electronic device 400 over time. The power management system 406 can take actions based on what the power management system 406 observes in the register 404.

Although the power management system 406 is shown as being separate from the controller 402, note that the power management system 406 can be part of the controller 402 in an alternative embodiment.

Figure 5:
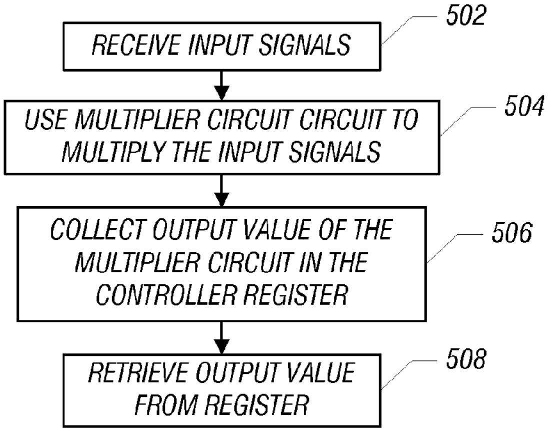
FIG. 5 is a flow diagram of a process of multiplying signals according to an embodiment.

FIG. 5 is a general flow diagram of a process performed in the electronic device 400 of FIG. 4. Input signals A, B are received (at 502) by the multiplier circuit 200 or 300. The multiplier circuit 200 or 300 is used (at 504) to multiply A and B. The output value of the multiplier circuit 200 or 300 is collected (at 506) in the register 404 of the controller 402. The register 404 can collect multiple output values over time to collect information about power consumption over time. Next, the power management system 406 retrieves (at 508) the output values from the register 404 to take an appropriate power management action in response to the detected power conditions. The power management action can include shutting off components, placing components into an inactive state or low power state, reporting power draw to the user, and so forth.

Although FIGS. 4 and 5 show an embodiment in which power consumption calculated by the multiplier circuit 200, 300, or 300A is used by a power management system 406, it is noted that in difference implementations, the power consumption calculated by the multiplier circuit 200, 300, or 300A can be used for other purposes.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A multiplier circuit to multiply a first signal with a second signal, comprising:

an analog-to-digital converter having a first input and a second input, wherein the first input is to receive the first signal; and an inverting circuit having an input to receive the second signal, and an output connected to the second input of the analog-to-digital converter, wherein the inverting circuit includes a linear regulator having a voltage input for connection to a power supply voltage, and a voltage output connected to the second input of the analog-to-digital converter, and wherein the linear regulator has an adjustment input for connection to the second signal, wherein an output value produced by a combination of the analog-to-digital converter and the inverting circuit is approximately a multiplication of the first signal and the second signal.

2. The multiplier circuit of claim 1, wherein the inverting circuit includes an operational amplifier and resistors to invert the second signal, wherein the output of the inverting circuit is to provide the inverted second signal.

3. The multiplier circuit of claim 1, wherein an increase in a voltage of the second signal causes a reduction in a voltage of the output of the linear regulator.

4. The multiplier circuit of claim 1, wherein the second input is one of a voltage reference input and a power supply voltage input of the analog-to-digital converter.

5. The multiplier circuit of claim 1, wherein the inverting circuit is to invert the second signal, and wherein the output of the inverting circuit is to provide the inverted second signal.

6. A multiplier circuit to multiply a first signal with a second signal, comprising:

an analog-to-digital converter having a first input and a second input, wherein the first input is to receive the first signal; and an inverting circuit having an input to receive the second signal, and an output connected to the second input of the analog-to-digital converter, wherein an output value produced by a combination of the analog-to-digital converter and the inverting circuit is approximately a multiplication of the first signal and the second signal, wherein the inverting circuit includes an operational amplifier and resistors to invert the second signal, wherein the output of the inverting circuit is to provide the inverted second signal, wherein the operational amplifier has an inverting input for connection to the second signal through a first of the resistors, wherein the operational amplifier has an output connected to the second input of the analog-to-digital converter, and wherein a second of the resistors is connected between the inverting input and the output of the operational amplifier.

7. The multiplier circuit of claim 6, wherein the operational amplifier further has a non-inverting input for connection to a reference voltage.

8. The multiplier circuit of claim 6, wherein the first resistor has a resistance R1, the second resistor has a resistance R2, the first signal is represented as A, the second signal is represented as B, and wherein the output value is proportional to $$A \times B \times \frac{R2}{R1}.$$

9. The multiple circuit of claim 6, wherein a first node of the second resister is connected to the output of the operational amplifier, and a second node of the second register is connected to the inverting input of the operational amplifier.

10. A system comprising:

a controller; and a multiplier circuit comprising:

an analog-to-digital converter having a first input and a second input, wherein the first input is to receive a first signal;

an inverting circuit to receive a second signal and to invert the second signal, the inverting circuit having an output connected to the second input of the analog-to-digital converter, the output to provide the inverted second signal, wherein an output value produced by a combination of the analog-to-digital converter and the inverting circuit is approximately a multiplication of the first signal and the second signal, and wherein the first signal is representative of an electrical current, and the second signal is a voltage, and wherein the controller is to receive the output value that is an indication of power; and a power management system to retrieve the output value from the controller, and in response to the output value, to effect a power management action.

11. The system of claim 10, wherein the controller is to accumulate multiple instances of the output value of the multiplier circuit at multiple time points in a given time interval, and the power management system is configured to effect the power management action in response to the accumulated multiple instances of the output value.

12. The system of claim 10, wherein the voltage is a power supply voltage.

13. The system of claim 10, wherein the power management system is configured to shut off at least one component in response to the output value.

14. A method of multiplying a first signal with a second signal, comprising:

receiving the first signal at a signal input of an analog-to-digital converter, wherein the analog-to-digital converter further has a second input;

receiving the second signal at an input of an inverting circuit, wherein an output of the inverting circuit is connected to the second input of the analog-to-digital converter, wherein receiving the second signal at the input of the inverting circuit comprises receiving the second signal at the inverting circuit that includes one of an operational amplifier and a linear regulator; and providing an output from the analog-to-digital converter in response to the first signal and the output of the inverting circuit, wherein the output of the analog-to-digital converter is a digital value representing an approximate multiplication of the first signal and the second signal.

15. The method of claim 14, wherein the first signal represents an electrical current, and the second signal is a voltage, the method further comprising:

receiving the output of the analog-to-digital converter, wherein the output represents power.

16. The method of claim 14, wherein the inverting circuit inverts the second signal, and wherein the output of the inverting circuit provides the inverted second signal.

* * * * *